United States Patent
Hsu

(10) Patent No.: US 8,998,623 B2
(45) Date of Patent: Apr. 7, 2015

(54) ELECTRICAL CONNECTOR ASSEMBLY AND METHOD OF ASSEMBLING THE SAME

(71) Applicant: Hon Hai Precision Industry Co., Ltd., New Taipei (TW)

(72) Inventor: Shuo-Hsiu Hsu, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 14/054,859

(22) Filed: Oct. 16, 2013

(65) Prior Publication Data

US 2014/0106593 A1 Apr. 17, 2014

(30) Foreign Application Priority Data

Oct. 16, 2012 (TW) .............................. 101219960 U

(51) Int. Cl.
*H01R 12/00* (2006.01)
*H05K 7/10* (2006.01)
*H05K 3/34* (2006.01)

(52) U.S. Cl.
CPC .................. *H05K 7/10* (2013.01); *H05K 3/341* (2013.01); *H05K 7/1053* (2013.01)

(58) Field of Classification Search
CPC ........................... H01R 23/722; H01R 9/2408
USPC ............................. 439/70, 71, 717, 525, 526
See application file for complete search history.

(56) References Cited

U.S. PATENT DOCUMENTS

| | | | |
|---|---|---|---|
| 6,679,707 B1 * | 1/2004 | Brodsky et al. | 439/71 |
| 6,881,073 B2 * | 4/2005 | Bali et al. | 439/70 |
| 7,534,114 B2 | 5/2009 | Liao | |
| 7,682,160 B2 * | 3/2010 | Liao | 439/71 |
| 7,952,890 B2 * | 5/2011 | Myers et al. | 361/818 |
| 8,087,941 B2 * | 1/2012 | Liao et al. | 439/66 |

* cited by examiner

*Primary Examiner* — Phuongchi T Nguyen
(74) *Attorney, Agent, or Firm* — Wei Te Chung; Ming Chieh Chang

(57) ABSTRACT

An electrical connector assembly includes an insulating housing having a number of housing segments, a number of contacts received in the housing segments, a number of caps covering on the housing segments respectively and a number of clips assembled on the caps. Each of the caps includes a retaining mechanism defining an arm for operating by a user and a latch engaging the housing segment. Each of the clips is assembled on the arms of at least two caps so as to operate two caps together.

12 Claims, 4 Drawing Sheets

ELECTRICAL CONNECTOR ASSEMBLY AND METHOD OF ASSEMBLING THE SAME

BACKGROUND OF THE INVENTION

1. Field of the Invention

The present disclosure relates to an electrical connector assembly for connecting an IC package with a printed circuit board, and more particularly to an electrical connector assembly with clips for combining a plurality of caps together so as to pick and place a plurality of caps as a whole.

2. Description of Related Art

Various electrical connectors are widely used in computers and any other electronic devices. An electrical connector for connecting a central processing unit (CPU) to a printed circuit board (PCB) typically comprises an insulating housing and a plurality of contacts received in the insulating housing. A cap is assembled on the insulating housing for vacuum suction to mounting the insulating housing onto the PCB.

However, with the development of technology, more and more contacts are needed in the electrical connector, while the insulating housing retaining the contacts becomes bigger and bigger which result in many difficulties in manufacturing, such as the strength of the insulating housing is not enough and deformation easily. Therefore, an insulating housing having a plurality of housing segments is provided where the housing segments are manufactured separately and then assembled onto the PCB respectively. So a plurality of caps are needed corresponding to the housing segments. However, as a plurality of caps is assembled thereon, a user has to operate the caps respectively and many times of removing and assembling are needed which result in a high risk of damaging the contacts.

In view of the above, an improved electrical connector assembly is desired to overcome the problems mentioned above.

SUMMARY OF THE INVENTION

Accordingly, an object of the present disclosure is to provide an electrical connector assembly in which a plurality of caps can be removed and assembled easily and safely.

According to one aspect of the present disclosure, an electrical connector assembly is provided for electrically connecting an IC package with a printed circuit board. The electrical connector assembly comprises an insulating housing comprising a plurality of housing segments arranged side by side in a horizontal plane; a plurality of contacts received in the housing segments for contacting the IC package; a plurality of caps assembled on the housing segments respectively and correspondingly, each of the caps comprising a retaining mechanism for retaining the cap on the housing segment, the retaining mechanism comprising at least a latch engaging the housing segment and an arm for being grabbed by a user; and a clip assembled on the caps, the clip comprising a combining portion assembled on the arms of at least two caps for combining said two caps together and an operation portion for being operated by the user to remove said two caps together.

Other objects, advantages and novel features of the disclosure will become more apparent from the following detailed description when taken in conjunction with the accompanying drawings, in which:

DETAILED DESCRIPTION OF THE INVENTION

Reference will now be made to the drawings to describe the present disclosure in detail.

Figure 1:
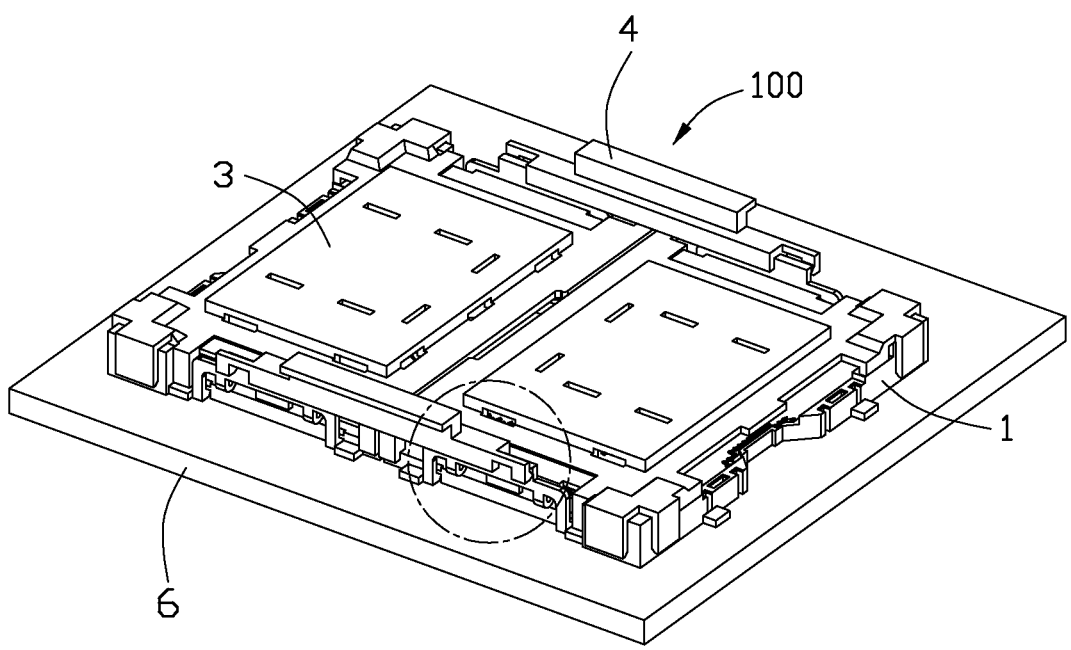
FIG. 1 is an assembled, perspective view of an electrical connector assembly with a PCB in accordance with a preferred embodiment of the present disclosure.
Figure 2:
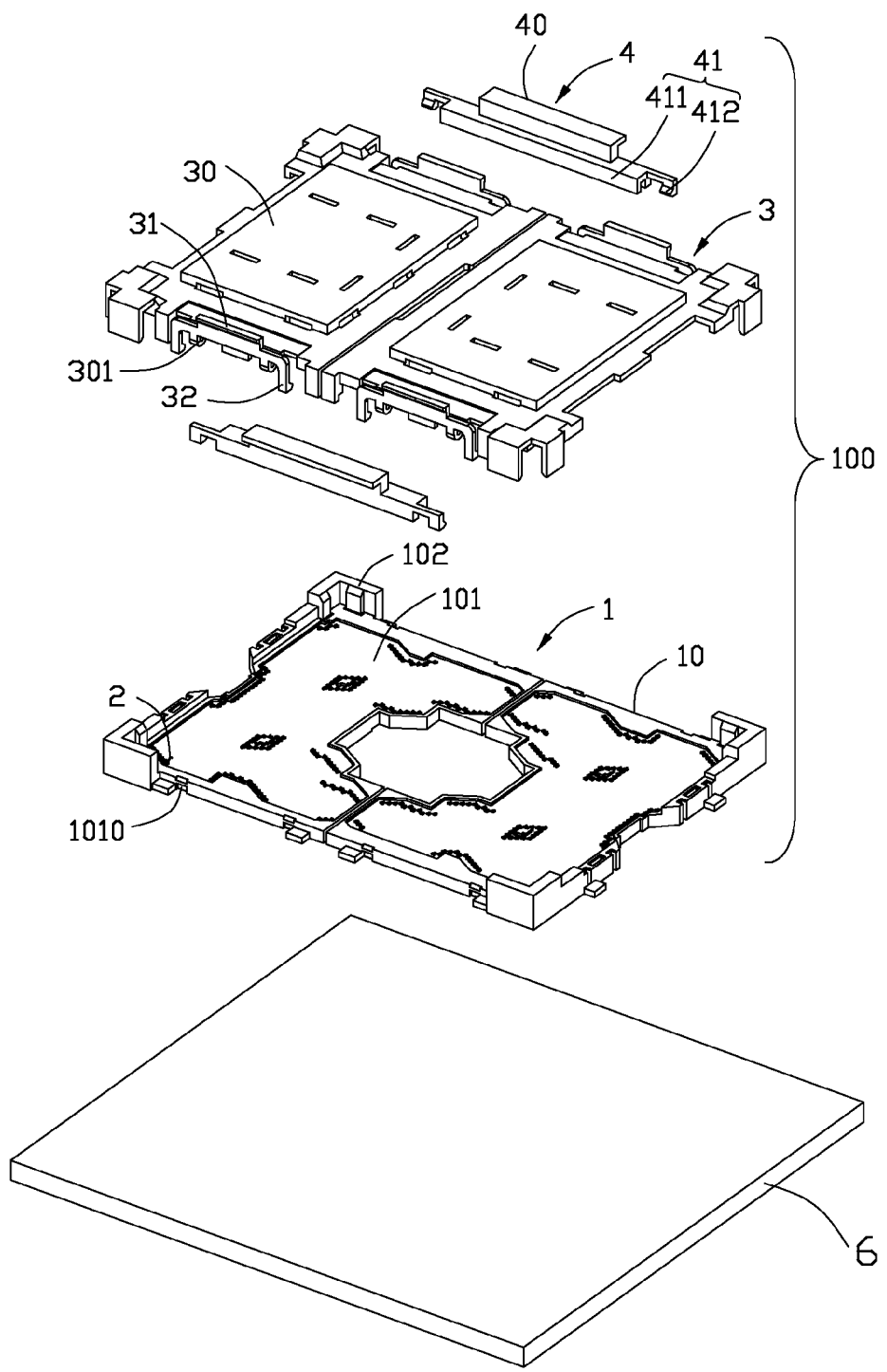
FIG. 2 is an exploded, perspective view of the electrical connector assembly and the PCB shown in FIG. 1.

Referring to FIG. 1 and FIG. 2, an electrical connector assembly 100 for electrically connecting an IC package (not shown) with a printed circuit board (PCB) 6, comprises an insulating housing 1, a plurality of contacts 2 received in the insulating housing 1, a plurality of caps 3 covering on the insulating housing 1, and a plurality of clips 4 for combining a plurality of caps 3 together.

Referring to FIG. 2, the insulating housing 1 comprises a plurality of housing segments 10. In a preferred embodiment of the present disclosure, the insulating housing 1 comprises two housing segments 10. Said two housing segments 10 are separated from each other. Each of the housing segments 10 comprises a bottom wall 101 and a side wall 102 extending upwardly from one end of the bottom wall 101. The bottom wall 101 comprises a plurality of recesses 1010 for engaging with the cap 3. Said two housing segments 10 are arranged side by side in a horizontal plane to form the insulating housing 1. The bottom walls 101 and the side walls 102 of the housing segments 10 define a cavity for accommodating the IC package. The contact 2 received in the bottom wall 101 comprises a contacting portion extending into the cavity for contacting the IC package.

The electrical connector assembly 100 comprises two caps 3 corresponding to two housing segments 10. The caps 3 cover on the housing segments 10 respectively for suction and protecting the contacts 2. Each cap 3 comprises a main body 30 having a surface for suction by vacuum suction device and a pair of retaining mechanisms at two ends of the main body 30 for retaining the cap 3 on the housing segment 10. The retaining mechanism comprises a deformation portion 301 firstly extending downwardly from the main body 30 and then extending upwardly forming a U shape, an arm 31 extending upwardly from the deformation portion 301 for operating by a user and a pair of latches 32 extending downwardly from the deformation portion 301 for engaging with the housing segment 10. When pressing the arm 31 towards the main body 30, the deformation portion 301 experiences an elastic deformation towards the main body 30 to release the latch 32 off from the housing segment 10.

Figure 3:
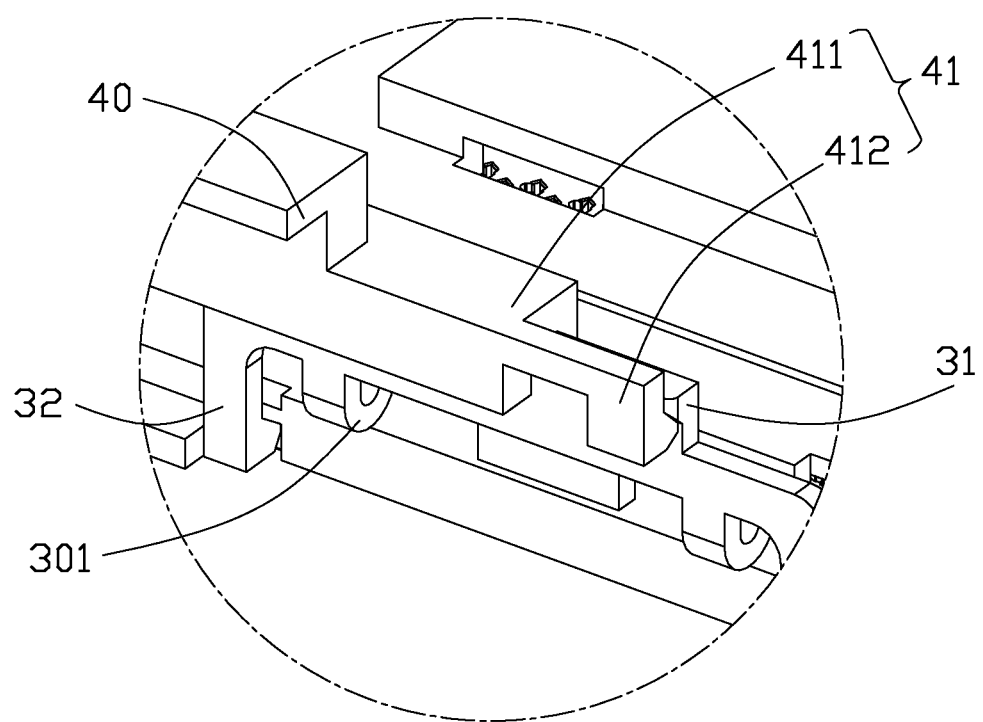
FIG. 3 is a partial enlarged view of a circle portion shown in FIG. 1.
Figure 4:
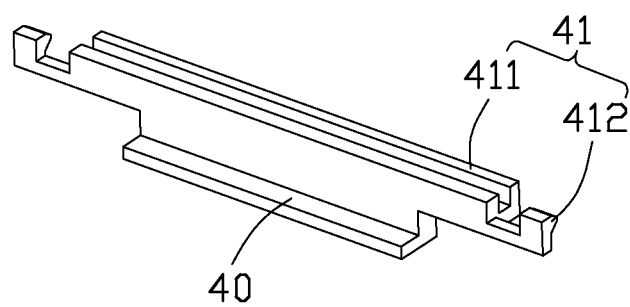
FIG. 4 is a perspective view of a clip shown in FIG. 1.

Referring to FIG. 3 and FIG. 4, the clip 4 extending in a longitudinal direction comprises a combining portion 41 and an operation portion 40 extending upwardly from the combining portion 41 in a vertical direction perpendicular to the longitudinal direction. The combining portion 41 comprises a gripping portion 411 defining a slot for retaining on the arm 31 of the cap 3 and a pair of hook portions 412 for driving the arm 31. The hook portions 412 locate on two sides of the gripping portion 411 in the longitudinal direction. The combining portion 41 is long enough to engaging two arms 31 simultaneously. In the preferred embodiment, the length of the combining portion 41 is at least twice the length of the arm 31 in the longitudinal direction.

In assembling, firstly, assembling the caps 3 on the housing segment 10 respectively by the latches 32 engaging with the recesses 1010; secondly, arranging the housing segments 10 on the PCB 6 by a vacuum suction device suction on the caps 3 and then soldering the housing segments 10 thereon; lastly, assembling the clip 4 on the caps 3 by the combining portion 41 of the clip 4 engaging the arms 31 of the caps 3. Therefore, two caps 3 are combined together and said two caps 3 can be released and assembled simultaneously by pressing the operation portion 40 of the clip 4. Thus, a plurality of caps 3 can be operated easily and quickly, and the risk of damaging the contacts 2 by operating the caps 3 many times is reduced.

While preferred embodiment in accordance with the present disclosure has been shown and described, equivalent modifications and changes known to persons skilled in the art according to the spirit of the present disclosure are considered within the scope of the present disclosure as defined in the appended claims.

What is claimed is:

1. An electrical connector assembly for electrically connecting an IC package with a printed circuit board comprising:
    an insulating housing comprising a plurality of housing segments arranged side by side in a horizontal plane;
    a plurality of contacts received in the housing segments for contacting the IC package;
    a plurality of caps covering on the housing segments respectively and correspondingly, each of the caps comprising a retaining mechanism for retaining the cap on the housing segment, the retaining mechanism comprising at least a latch engaging the housing segment and an arm for being grabbed; and
    a clip assembled on the caps, the clip comprising a combining portion assembled on the arms of at least two caps for combining said two caps together and an operation portion for being operated by a user to remove said two caps together;
    wherein the combining portion comprises a gripping portion extending in a longitudinal direction defining a slot and a pair of hook portions at two sides of the gripping portion in the longitudinal direction;
    wherein each of the caps comprises two retaining mechanisms at two opposite ends of the cap, the retaining mechanisms on the same ends of the caps are in the same line in the longitudinal direction.

2. The electrical connector assembly as claimed in claim 1, wherein the length of the combining portion is at least twice the length of the arm in the longitudinal direction.

3. The electrical connector assembly as claimed in claim 1, wherein the insulating housing is formed by two housing segments arranged adjacent to each other, said two housing segments are separated from each other.

4. The electrical connector assembly as claimed in claim 1, wherein the cap comprises a main body, the retaining mechanism locates on an end of the main body and further comprises a U-shaped deformation portion extending downwardly from the main body and then extending upwardly.

5. The electrical connector assembly as claimed in claim 4, wherein the arm extends upwardly from the deformation portion while the latch extends downwardly from the deformation portion.

6. The electrical connector assembly as claimed in claim 5, wherein the housing segment comprises a recess at a side of the housing segment, the latch of the cap engages with the recess.

7. A method for assembling an electrical connector assembly onto a printed circuit board, the method comprising:
    providing an insulating housing comprising at least two housing segments, each housing segment having a cap assembled thereon, the cap comprising a main body for suction by a vacuum suction device and a retaining mechanism for retaining on the housing segment;
    arranging the housing segments onto the printed circuit board and soldering thereon by suction on the caps; and
    providing a clip and assembling the clip on the retaining mechanisms of at least two caps to combine at least two caps together so as to release and assemble said two caps simultaneously by operating the clip;
    wherein the retaining mechanism comprises at least a latch engaging the housing segment and an arm for being grabbed;
    wherein the clip comprises a combining portion assembled on the arms of at least two caps and an operation portion extending upwardly from the combining portion for being operated by a user;
    wherein the combining portion comprises a gripping portion extending in a longitudinal direction defining a slot and a pair of hook portions at two sides of the gripping portion in a longitudinal direction;
    wherein each of the caps comprises two retaining mechanisms at two opposite ends of the cap, the retaining mechanisms on the same ends of the caps are in the same line.

8. The method as claimed in claim 7, wherein the insulating housing is formed by two housing segments arranged adjacent to each other, said two housing segments are separated from each other before soldering on the printed circuit board.

9. The method as claimed in claim 7, wherein the retaining mechanism further comprises a deformation portion extending downwardly from the main body and then extending upwardly.

10. An electrical connector assembly comprising:
    opposite first and second housing units with corresponding first and second contacts disposed therein; a commonly receiving space formed by said first housing unit and said second housing unit for receiving an electronic package; first and second pick-up caps respectively mounted upon the first and second housing units for respectively mounting the corresponding first and second housing units to a common printed circuit board; and
    a common clip discrete from said first and second pick-up caps while being detachably simultaneously attached to said first and second pick-up caps and removing said first and second pick-up caps simultaneously after the first and second housing units are mounted to the common printed circuit board;
    wherein said common clip includes means for grasping the respective first and second pick-cup caps and means for releasing the first and second pick-up caps from the corresponding first and second housing units, respectively;
    further including another common clip detachably attached to the first ands second pick-up caps opposite to the commonly clip in a first direction, wherein said commonly clip and said another common clip are configured to be closer to each other around corresponding upper handle sections for releasing corresponding latches of the first and second pick-up caps from the corresponding first and second housing units, respectively.

11. The electrical connector assembly as claimed in claim 10, wherein the upper handle sections of the common clips are higher than the corresponding pick-up caps, respectively.

12. The electrical connector assembly as claimed in claim 10, wherein said first housing unit and said second housing unit are symmetrical with regard to each other via an interface therebetween, said common clip transverse extends across said interface.

* * * * *